United States Patent
Drapkin et al.

(10) Patent No.: US 8,014,125 B2
(45) Date of Patent: Sep. 6, 2011

(54) CHIP CAPACITOR

(75) Inventors: Oleg Drapkin, Richmond Hill (CA);
Grigori Temkine, Markham (CA);
Kristina Au, Richmond Hill (CA)

(73) Assignee: ATI Technologies ULC (CA)

( * ) Notice: Subject to any disclaimer, the term of this patent is extended or adjusted under 35 U.S.C. 154(b) by 752 days.

(21) Appl. No.: 11/945,089

(22) Filed: Nov. 26, 2007

(65) Prior Publication Data

US 2009/0133252 A1 May 28, 2009

(51) Int. Cl.
*H01G 4/06* (2006.01)

(52) U.S. Cl. ........ 361/311; 361/309; 361/312; 361/313; 361/321.2; 361/306.1

(58) Field of Classification Search .................. 361/311, 361/312–313, 321.1, 321.2, 301.4, 306.2
See application file for complete search history.

(56) References Cited

U.S. PATENT DOCUMENTS

| | | | |
|---|---|---|---|
| 6,266,226 B1 * | 7/2001 | Hayashi | 361/303 |
| 6,297,524 B1 * | 10/2001 | Vathulya et al. | 257/303 |
| 6,410,954 B1 * | 6/2002 | Sowlati et al. | 257/306 |
| 6,609,905 B2 | 8/2003 | Eroglu et al. | |
| 6,649,852 B2 * | 11/2003 | Chason et al. | 200/181 |
| 7,154,734 B2 * | 12/2006 | Schultz et al. | 361/306.1 |
| 7,738,237 B2 * | 6/2010 | Lee | 361/311 |
| 2005/0013087 A1 | 1/2005 | Wu et al. | |

OTHER PUBLICATIONS

International Search Report for International Application No. PCT/IB2008/003002, completed by Terry Cartile on Mar. 24, 2009 and mailed to the applicant on Mar. 31, 2009 (4 pages).
Written Opinion of the International Searching Authority for International Application No. PCT/1132008/003002, completed by Terry Cartile on Mar. 24, 2009 and mailed to the applicant on Mar. 31, 2009 (7 pages).

* cited by examiner

*Primary Examiner* — Nguyen T Ha
(74) *Attorney, Agent, or Firm* — Sterne, Kessler, Goldstein & Fox P.L.L.C.

(57) ABSTRACT

Various capacitors for use with integrated circuits and other devices and fabrication methods are disclosed. In one aspect, a method of manufacturing is provided that includes forming a first capacitor plate that has at least two non-linear strips and forming a second capacitor plate that has a non-linear strip positioned between the at least two non-linear strips of the first capacitor plate. A dielectric is provided between the non-linear strip of the second capacitor plate and the at least two non-linear strips of the first capacitor plate.

25 Claims, 5 Drawing Sheets

CHIP CAPACITOR

BACKGROUND OF THE INVENTION

1. Field of the Invention

This invention relates generally to semiconductor processing, and more particularly to semiconductor chip capacitors and methods of making the same.

2. Description of the Related Art

Conventional integrated circuits use capacitors for a variety of purposes, such as data storage, low pass, high pass and band pass signal filtering, and power rail decoupling. Some types of capacitors are manufactured as discrete components that are designed to be connected externally to a semiconductor chip. Typical semiconductor chip package substrate capacitors are an example of the discrete variety. Other types of semiconductor chip capacitors are built directly into the semiconductor chip. These on-die capacitors tend to be smaller than, and thus more constrained by the pressures of device scaling, than their off-chip counterparts.

One type of conventional capacitor design consists of a stack that has several levels of conductor plates. Two plates in a given level include interwoven conductive strips that form a structure that resembles a pair of hair combs meshed together teeth-to-teeth. The interwoven strips are straight rectangular structures.

The capacitance of almost all types of capacitors is a function of the dielectric constant of the medium separating the capacitor plates, the area of overlap of the capacitor plates, and the spacing between the capacitor plates. For the comb-style capacitor described above, the total capacitance is a sum of inter plate capacitance and another form of capacitance known as fringe capacitance. Both the inter plate capacitance and the fringe capacitance are proportional to plate overlap area. However, the overlap areas for the two types of capacitance are usually in two different but orthogonal planes.

Device scaling in semiconductor chip manufacturing is an almost ever present goal of integrated circuit designers. As the critical dimensions of lithographic fabrication processes continue to fall, devices other than transistors, resistors and conductor lines must also scale downward. For on-chip capacitors, device scaling represents a challenge. The goal is to at least maintain acceptable levels of total available on-chip capacitance while simultaneously shrinking the size of individual capacitors. Better dielectrics may be used, but not without material and manufacturing costs. Plate spacings could be lowered, but at greater risks of dielectric breakdown.

One conventional technique for improving decoupling involves providing more raw capacitance on the die. However, this technique may be severely constrained by the requirements of packing density or will lead to die size growth.

The present invention is directed to overcoming some of the aforementioned challenges.

SUMMARY OF THE INVENTION

In accordance with one aspect of the present invention, a method of manufacturing is provided that includes forming a first capacitor plate that has at least two non-linear strips and forming a second capacitor plate that has a non-linear strip positioned between the at least two non-linear strips of the first capacitor plate. A dielectric is provided between the non-linear strip of the second capacitor plate and the at least two non-linear strips of the first capacitor plate.

In accordance with another aspect of the present invention, a method of manufacturing is provided that includes forming a first capacitor plate that has a first plurality of stacked conductor structures and forming a second capacitor plate that has a second plurality of stacked conductor structures positioned adjacent to the first plurality of conductor structures. A dielectric is formed between the first and second pluralities of conductor structures.

In accordance with another aspect of the present invention, a method of manufacturing, is provided that includes providing a semiconductor chip and forming a first capacitor plate in the semiconductor chip wherein the first capacitor plate has a first opening. A capacitor dielectric is formed in the first opening of the first capacitor plate. The capacitor dielectric has second opening. A second capacitor plate is formed in the second opening of the capacitor dielectric.

In accordance with another aspect of the present invention, an apparatus is provided that includes a first capacitor plate that has at least two non-linear strips and a second capacitor plate that has a non-linear strip positioned between the at least two non-linear strips of the first capacitor plate. A dielectric is positioned between the non-linear strip of the second capacitor plate and the at least two strips of the first capacitor plate.

In accordance with another aspect of the present invention, an apparatus is provided that includes a first capacitor plate that has first plurality of stacked conductor structures and a second capacitor plate that has a second plurality of stacked conductor structures positioned adjacent to the first plurality of conductor structures. A dielectric is positioned between the first and second pluralities of conductor structures.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
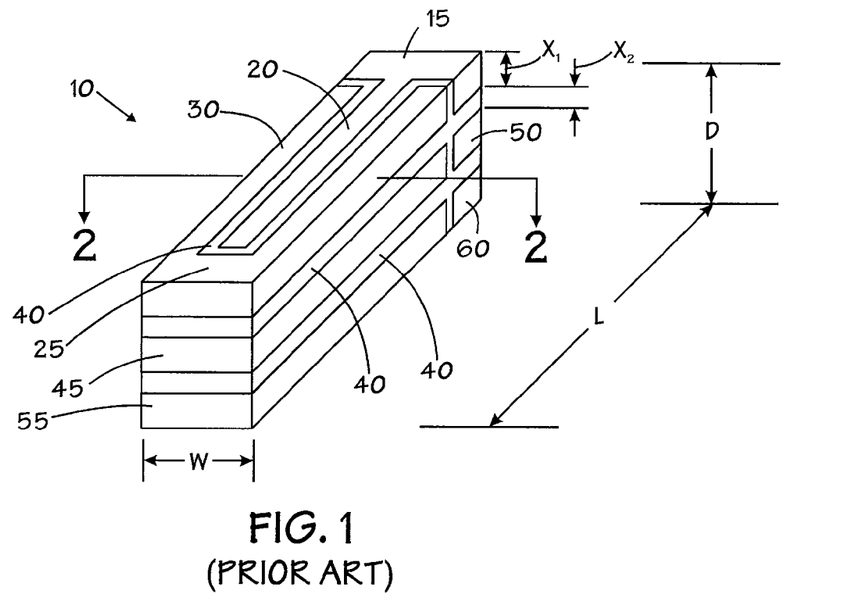
FIG. 1 is a pictorial view of a conventional comb style multiple plate capacitor.

In the drawings described below, reference numerals are generally repeated where identical elements appear in more than one figure. Turning now to the drawings, and in particular to FIG. 1, therein is shown a pictorial view of a conventional comb style multiple plate capacitor 10. An electrode 15 positioned at the top of the capacitor 10 includes an elongated strip 20 that is nested within an electrode 25, and in particular two strips 30 and 35 thereof. A dielectric material 40 is interposed between the strips 20, 30 and 35. Successive pairs of plates 45 and 50 and 55 and 60 are stacked beneath the pair of electrodes 15 and 25. The capacitor dielectric 40 segregates not only the electrodes 15 and 25 but also the various electrodes in the stack, namely, the electrodes 15 and 25 and the next lower pair of electrodes 45 and 50 and so on. The electrodes 15 and 25 have a thickness $X_1$. The pair of electrodes 15 and 25 have a vertical spacing $X_2$ from the next lower pair of electrodes 35 and 45. The capacitor 10 has an overall length L, width W and thickness D.

Figure 2:
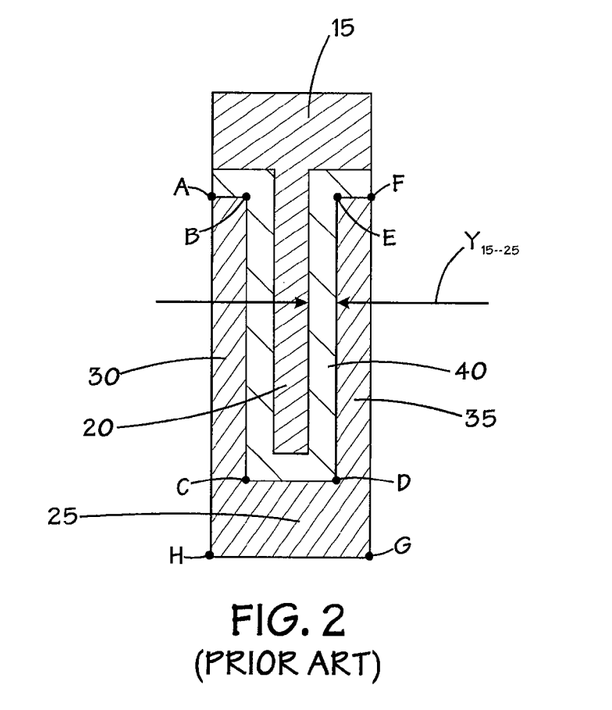
FIG. 2 is a sectional view of FIG. 1 taken at section 2-2.

Additional detail of the conventional capacitor 10 may be understood by referring now to FIG. 2, which is a sectional view of FIG. 1 taken at section 2-2. Before turning to FIG. 2, it is important to note that section 2-2 in FIG. 1 passes through the pair of electrodes 15 and 25 and the portion of the capacitor dielectric 40 positioned between the electrodes 15 and 25. With that backdrop, attention is now turned to FIG. 2. The fringe capacitance $C_{Fringe15\text{--}25}$ of the combination of the electrodes 15 and 25 is given by:

$$C_{Fringe15\text{--}25} = \kappa \varepsilon_0 \frac{A_{overlap15\text{--}25}}{Y_{15\text{--}25}} \quad \text{Equation 1}$$

where $\kappa$ is the dielectric constant of the dielectric material 40, $\varepsilon_0$ is the permittivity constant of about $8.85 \times 10^{-12}$ $C^2/N \cdot m^2$ where C is coulombs, N is newtons and m is meters, $A_{overlap15\text{--}25}$ is area of overlap between the electrodes 15 and 25 and $Y_{15\text{--}25}$ is the gap between the electrodes 15 and 25. To express the area of overlap $A_{overlap15\text{--}25}$ between the electrodes 15 and 25 in more detail, points A, B, C, D, E and F on the electrode 25 are identified in FIG. 2. The area of overlap between the electrodes 15 and 25 is given by the sum of the line segments $\overline{AB}$, $\overline{BC}$, $\overline{CD}$, $\overline{DE}$ and $\overline{EF}$ multiplied by the thickness $X_1$ shown in FIG. 1 or:

$$A_{overlap15\text{--}25} = (\Sigma \overline{AB}, \overline{BC}, \overline{CD}, \overline{DE}, \overline{EF})(X_1) \quad \text{Equation 2}$$

The inter plate capacitance $C_{25\text{--}45}$ for two electrodes, such as the electrodes 25 and 45, is proportional to the area $A_{25}$ of the electrode 25 divided by the gap $X_2$ between the electrode 25 and the next lower electrode 45. To describe the area $A_{25}$ of the electrode 25, two more points G and H are defined on FIG. 2. Thus, the area $A_{25}$ of the electrode 25 is defined as the area bounded by the line segments $\overline{AB}$, $\overline{BC}$, $\overline{CD}$, $\overline{DE}$, $\overline{EF}$, $\overline{FG}$, $\overline{GH}$ and $\overline{HA}$. A notable feature of the conventional comb style capacitor 10 depicted in FIGS. 1 and 2 is that the strips, such as the strip 20 of the electrode 15 and the strips 30 and 35 of the electrode 25 are linear.

Figure 3:
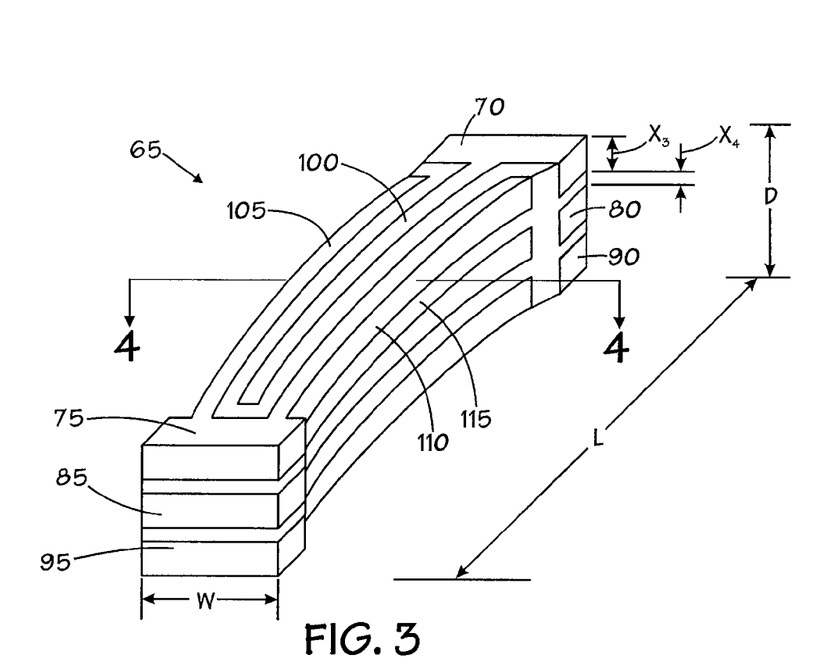
FIG. 3 is a pictorial view of an exemplary embodiment of a multiple plate capacitor.

An exemplary embodiment of a capacitor 65 that provides for enhanced capacitance without substantially increasing the area required for the capacitor may be understood by referring now to FIG. 3, which is a pictorial view. The capacitor 65 may be used on-chip, that is, as an integral component of a semiconductor chip or as a separate device that may be coupled to another electronic device, such as a printed circuit board or other device. The exemplary capacitor 65 may consist of a stack of electrode pairs 70 and 75, 80 and 85 and 90 and 95. The pair of electrodes 70 and 75 as well as the other pairs 80 and 85 and 90 and 95 are comb like in that the electrode 70 may include a strip 100 nested within strips 105 and 110 of the electrode 75. A capacitor dielectric 115 is interposed between the electrodes 70 and 75 as well as between the succeeding electrode pairs 80 and 85 and 90 and 95 in the capacitor 65. The capacitor dielectric 115 segregates not only the electrodes 70 and 75 but also the various electrodes in the stack, namely, the electrodes 80 and 85 and the next lower pair of electrodes 90 and 95 and so on. The capacitor dielectric 115 may be a unitary structure or composed of multiple insulating layers as desired. The electrodes 70 and 75 have a thickness $X_3$. The pair of electrodes 70 and 75 have a vertical spacing $X_4$ from the next lower pair of electrodes 80 and 85. Unlike the conventional comb-like capacitor depicted in FIGS. 1 and 2, the capacitor 65 in this illustrative embodiment has electrodes with nonlinear strips, for example, the strips 100, 105 and 110. The nonlinear strips 100, 105 and 110 provide a larger overlap area and thus a larger fringe capacitance for a given overall capacitor size than a conventional comb style capacitor that utilizes lines strips. Assume for the purposes of this illustration that the capacitor 65 shares the same overall length L, width W and thickness D as the conventional capacitor 10 depicted in FIGS. 1 and 2.

Figure 4:
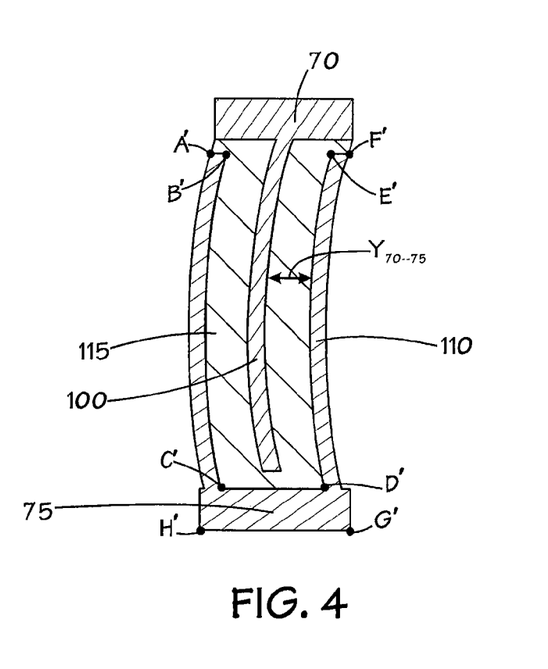
FIG. 4 is a sectional view of FIG. 3 taken at section 4-4.

Additional detail regarding the capacitor 65 may be understood by referring now to FIG. 4, which is a sectional view of FIG. 3 taken at section 4-4. It should be remembered that section 4-4 of FIG. 1 passes through the pair of electrodes 70 and 75 and the portion of the capacitor dielectric 115 co-located with the electrodes 70 and 75. Attention is now turned to FIG. 4. As described above, the strips 105 and 110 of the electrode 75 and the strip 100 of the electrode 70 are nonlinear. In this illustrative embodiment, the strips 105, 110 and 115 have a generally arcuate shape that provides a larger overlap area for capacitance purposes than a comparable set of linear interlocking strips. The fringe capacitance $C_{Fringe70\text{--}75}$ for the electrodes 70 and 75 is given by:

$$C_{Fringe70\text{--}75} = \kappa \varepsilon_0 \frac{A_{overlap70\text{--}75}}{Y_{70\text{--}75}} \quad \text{Equation 3}$$

where $\kappa$ is the dielectric constant of the dielectric material 115, $\varepsilon_0$ is the permittivity constant $8.85 \times 10^{-12}$ $C^2/N \cdot m^2$, $A_{overlap70\text{--}75}$ is the area of overlap between the electrodes 70 and 75 and $Y_{15\text{--}25}$ is the gap between the electrodes 70 and 75. To express the area of overlap $A_{overlap70\text{--}75}$ between the electrodes 70 and 75 in more detail, points A', B', C', D', E' and F' on the electrode 75 are identified in FIG. 4. The area of overlap between the electrodes 70 and 75 is given by the sum of the segment $\overline{A'B'}$, the arc $S_{B'C'}$ between points B' and C', the segment $\overline{C'D'}$, the arc $S_{D'E'}$ between points D' and E' and the segment $\overline{E'F'}$ multiplied by the thickness $X_3$ shown in FIG. 3 or:

$$A_{overlap70\text{--}75} = (\Sigma \overline{A'B'}, S_{B'C'}, \overline{C'D'}, S_{D'E'}, \overline{E'F'})(X_3) \quad \text{Equation 4}$$

The fact that the strips 100, 105 and 110 are nonlinear and thus exhibit a longer perimeter than a comparable conventional linear type strip means that the overlap area for fringe capacitance purposes is larger than is possible for a linear type comb capacitor of comparable overall size. Of course, the inter plate capacitance, that is, the capacitance between, for example, the plates 75 and 85 is given by the area of the plate 75 multiplied by $\varepsilon \varepsilon_0$ and divided by the spacing $X_4$ between the plates 75 and 85. The area of the plate 75 is given by the area bounded by the aforementioned segment $\overline{A'B'}$, the arc $S_{B'C'}$ between points B' and C', the segment $\overline{C'D'}$, the arc $S_{D'E'}$ between points D' and E' and the segment $\overline{E'F'}$, plus the area bounded by the perimeter from points F' to G', from points G' to H' and from points H' to A'. In roughly the same volume L×W×D as the conventional capacitor 10, the capacitor 65 can provide a higher total capacitance. Thus, if the size of the capacitor 65 must be scaled, as might be the case where a semiconductor fabrication process is scaled to a smaller node, useful levels of capacitance may be preserved even at smaller geometries.

Figure 5:
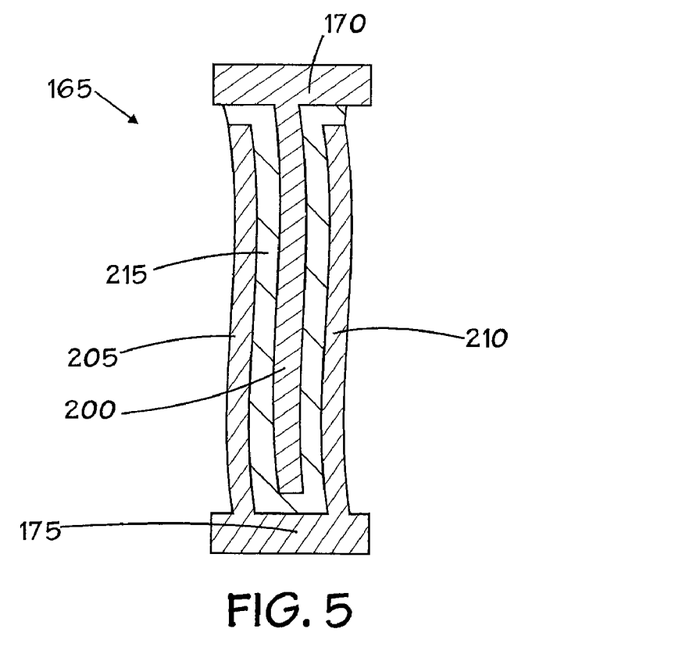
FIG. 5 is a sectional view like FIG. 4, but of another exemplary embodiment of a capacitor.

Another exemplary embodiment of a capacitor 165 that utilizes nonlinear interlocking strips is depicted in FIG. 5. In this illustrative embodiment, the exemplary capacitor 165 is shown in a sectional view that is similar to the sectional view depicted in FIG. 4. Here, two electrodes 170 and 175 are depicted with respective interlocking strips 200, 205 and 210 that are electrically insulated by way of a capacitor dielectric 215. As with the previously disclosed embodiment, the electrodes 170 and 175 have nonlinear strips 200, 205 and 210 that provide for a larger effective overlap area for capacitance purposes than a conventional linear strip capacitor. In this embodiment, the strips 200, 205 and 210 have a wavy shape.

Figure 6:
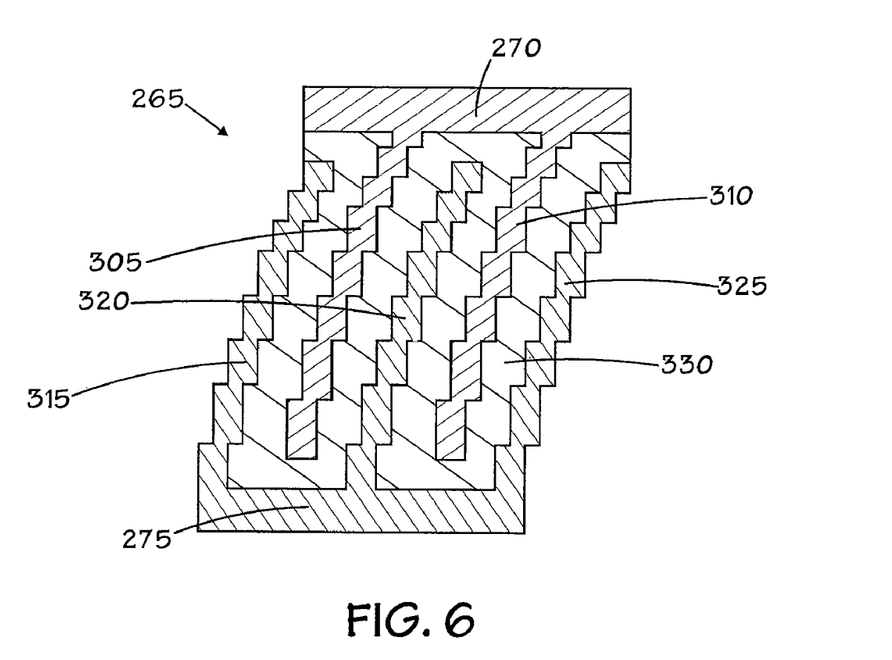
FIG. 6 is a sectional view like FIG. 5, but of still another exemplary embodiment of a capacitor.

A sectional view of another illustrative embodiment is depicted in FIG. 6. Here, a capacitor 265 is depicted in a sectional view like FIGS. 4 and 5. The capacitor 265 includes an electrode 270 and an electrode 275. The electrode 270 includes a set of strips 305 and 310 interwoven with a corresponding set of strips 315, 320 and 325 of the electrode 275 but separated by a capacitor dielectric 330. The strips 305, 310, 315, 320 and 325 are nonlinear in geometry. In this illustrative embodiment, a given strip, such as the strip 315, is provided with a combination of an arcuate and a stair step geometry which again provides a much larger overlap area for fringe capacitance purposes than a conventional linear type electrode strip. A stair step geometry may be more straightforward to pattern lithographically than a purely curved shape since current lithographic processes and reticles tend to use combinations of polygonal shapes to build various circuit features. It should be understood that the number of strips for a given electrode may be one or more and in fact may be virtually any number depending upon the discretion of the designer. Indeed any of the illustrative embodiments disclosed herein may use one or more strips for a given electrode. It should also be understood that a capacitor using the nonlinear strips as disclosed herein may include one or more levels of plates as desired.

Figure 7:
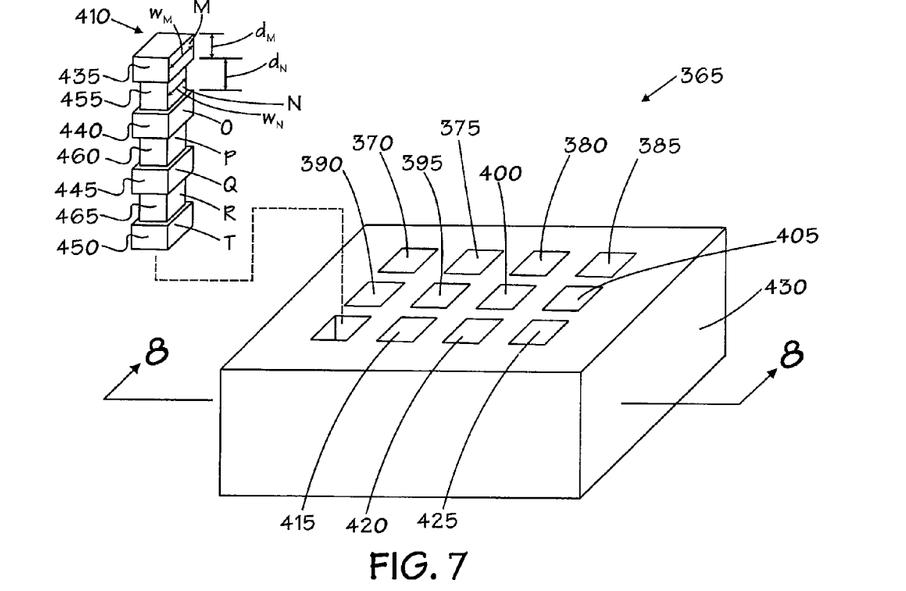
FIG. 7 is a pictorial view of another exemplary embodiment of a capacitor.

Attention is now turned to FIG. 7, which is a pictorial view of another exemplary embodiment of a capacitor 365 that includes a plurality of plates 370, 375, 380, 385, 390, 395, 400, 405, 410, 415, 420 and 425 that are electrically isolated from one another by a dielectric 430. The dielectric 430 may be a discrete structure in that the capacitor 365 itself may be some discrete structure that may be used external to some other electronic device such as an integrated circuit. Optionally, the dielectric 430 may be part of some larger dielectric layer or layers such as might be used in a semiconductor chip, for example. Only small portions of the plates 370, etc. are visible in FIG. 7 due to the presence of the dielectric material 430. Accordingly, the plate 410 is shown exploded from the capacitor to illustrate an exemplary structure of the plates 370, 375, 380, 385, 390, 395, 400, 405, 410, 415, 420 and 425. The plate 410 may consist of one or more, in this case four, conductor structures 435, 440, 445 and 450 that are interconnected by three other conductor structures 455, 460 and 465. The fringe capacitance $C_{Fringe410-415}$ between the plate 410 and an adjacent plate, such as the plate 415, is a function of overlap area $A_{overlap410-415}$ of the plates 410 and 415. The overlap area $A_{overlap410-415}$ of the plates 410 and 415 is the combined area of the surfaces M, N, O, P, Q, R and T. If the conductor structures 435, 440, 445 and 450 are substantially identical and the conductor structures 455, 460 and 465 are substantially identical, and dimensions of the surfaces M and N are $w_M$, $d_M$ and $w_N$ and $d_N$, respectively, then the overlap area simplifies to:

$$A_{overlap410-415}=(4w_Md_M)+(3w_Nd_N) \quad \text{Equation 5}$$

Figure 8:
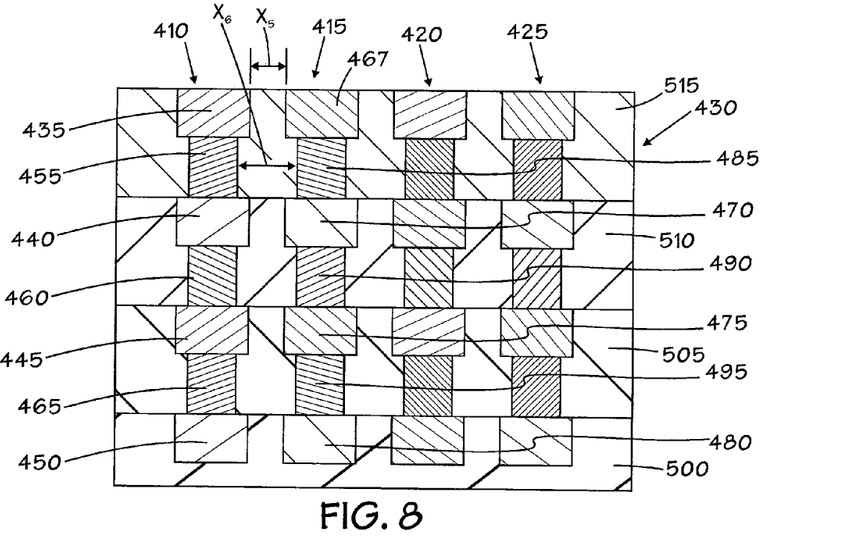
FIG. 8 is a sectional view of FIG. 7 taken at section 8-8.

Additional details regarding the capacitor and the plates 370, etc. may be understood by referring now to FIG. 8, which is a sectional view of FIG. 7 taken at section 8-8. Note that the location of section 8-8 of FIG. 7 is such that the plates 410, 415, 420 and 425 will appear in section. With that backdrop, attention is now turned to FIG. 8. As noted above, the electrode 410 may consist of the conductor structures 435, 440, 445 and 450 that are interconnected by the conductor structures 455, 460 and 465. The plate 415 may be similarly composed of successively vertically positioned conductor structures 467, 470, 475 and 480 that are interconnected by three conductor structures 485, 490 and 495. The other plates 420 and 425 may be similarly configured although their individual components are not separately labeled. Note the gap $X_5$ between the conductor structures 435 and 467 and the gap $X_6$ between the conductor structures 455 and 485. If the sizes of the conductor structures 435, 440, 445 and 450 are close to the sizes of the conductor structures 455, 460 and 470, then the gaps $X_5$ and $X_6$ may be treated as the same mathematically and the gap between the plates 410 and 415 may be treated as $X_5$.

The fringe capacitance for two adjacent plates, such as the plates 410 and 415, is given by:

$$C_{Fringe410-415} = \kappa\varepsilon_0 \frac{A_{overlap410-415}}{X_5} \quad \text{Equation 6}$$

and $A_{overlap410-415}$ may be taken from Equation 5 above to yield:

$$C_{Fringe410-415} = \kappa\varepsilon_0 \frac{(4w_Md_M) + (3w_Nd_N)}{X_5} \quad \text{Equation 7}$$

By providing what amounts to an array of plates 370, 375, 380, 385, 390, 395, 400, 405, 410, 415, 420 and 425, where the various plates will overlap with each other to enhance the overall capacitance, such as the plate 370 exhibiting fringe capacitance with both the plate 375 and the plate 390, a significant amount of capacitance can be provided in a relatively small volume, which may be useful particularly in on-chip capacitor applications.

As noted above, the capacitor dielectric 430 may be a unitary structure, or as illustrated in FIG. 8, may consist of a plurality of stacked insulating material layers 500, 505, 510 and 515. This type of arrangement may be useful where it is desired to thread the fabrication of the capacitor 365 into an existing lithographic manufacturing process flow for a semiconductor chip. For example, the various layers of dielectric 500, 505, 510 and 515 may be fabricated along with the various interlevel dielectric layers that are frequently used in semiconductor chips. The same is true for the fabrication of the multiple conductors 435, 440, 445 and 450 and 465, 470, 475 and 480 of the plates 410 and 415 where those conductors may be formed using the same lithographic steps and material deposition and removal steps that would be used to form other structures on a semiconductor chip for example. Similarly, the conductor structures 455, 460 and 465 may be manufactured as vias that are used to establish vertical interconnects between vertically displaced conductor layers.

The number and arrangement of plates 370, 375, 380, 385, 390, 395, 400, 405, 410, 415, 420 and 425 as well as the configuration thereof may be varied. For example, components of the plates 370, 375, 380, 385, 390, 395, 400, 405, 410, 415, 420 and 425 are depicted as box-like structures. However, other than rectangular shapes may be used. Furthermore, two given plates need not be identical in structure.

For any of the embodiments disclosed herein, the electrodes or plates may be formed from a variety of conducting materials, such as, for example, copper, aluminum, gold, palladium, silver, platinum, p-type or n-type doped polysilicon, combinations of these or the like. Various fabrication techniques may be used, such as, for example, plating, stencil processes, physical vapor deposition, chemical vapor deposition or the like. Plate thickness may be varied to suit design needs. In an exemplary embodiment plate thickness may be about 0.3 to 0.8 micron. Capacitor dielectric materials may be, for example, oxides of silicon, silicon nitride, various high-K dielectrics, tetra-ethyl-ortho-silicate, boro-phospho-silicate-glasses, polymeric materials or the like. Various fabrication techniques may be used, such as, for example, spin coating, chemical vapor deposition, thermal oxidation or the like. Capacitor dielectric thickness may be varied to suit design needs. In an exemplary embodiment the capacitor dielectric thickness may be about 0.3 to 0.8 micron.

Figure 9:
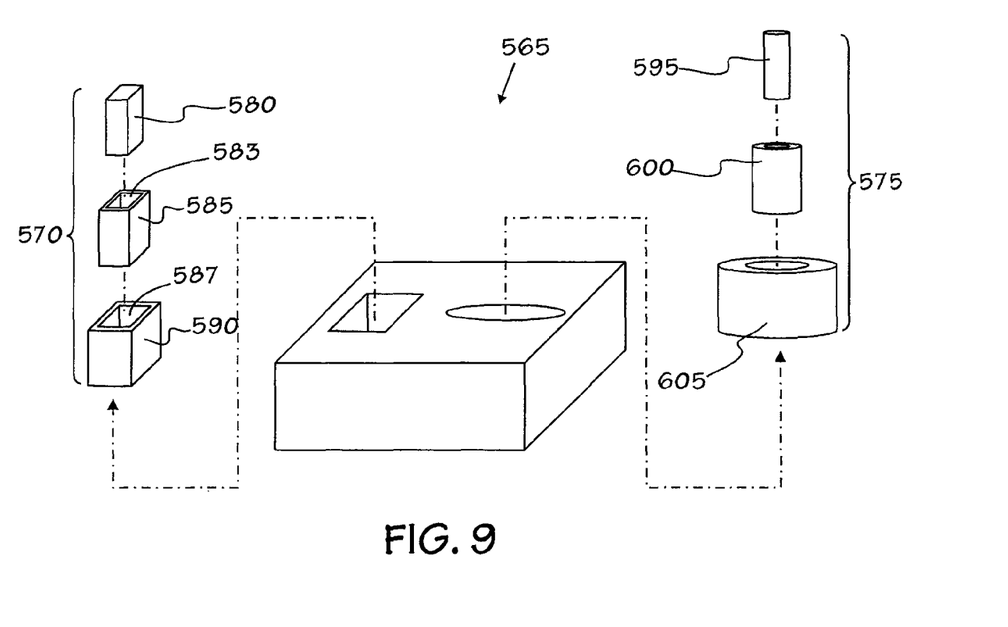
FIG. 9 is a pictorial view of another exemplary embodiment of a capacitor that incorporates nested plates.

Another exemplary embodiment of a capacitor 565 may be understood by referring now to FIG. 9, which is a pictorial view. The capacitor 565 may include two nested capacitors 570 and 575 that are shown exploded from the capacitor 565. The capacitor 570 is a nested configuration that may include a solid rectangular elongated capacitor plate 580 that is nested within an opening 583 of a rectangular shell capacitor dielectric 585. The capacitor dielectric is, in-turn, nested within an opening 587 of a rectangular shell capacitor plate 590. The capacitor 575 may be configured as a solid cylindrical plate 595 nested within a cylindrical shell capacitor dielectric 600. The capacitor dielectric 600 is, in-turn, nested within a cylindrical shell plate 605. The skilled artisan will appreciate that more than just two plates may be nested together to make up one of the capacitors 570, 575 etc. Furthermore, other than rectangular or cylindrical shapes may be used. Optionally, a given plate may be configured as a multiple conductor arrangement of the type shown in FIGS. 7 and 8 and described therewith. While just two capacitors 575 and 570 make up the overall capacitor 565, it should be understood that the number of capacitors that make up the overall capacitor 565 may be varied. In addition, multiple copies of the capacitor 570 and/or the capacitor 575 could be stacked vertically. The elements of the capacitors 570 and 575 may be form from the same materials and using the same processes as disclosed for the other embodiments herein.

Figure 10:
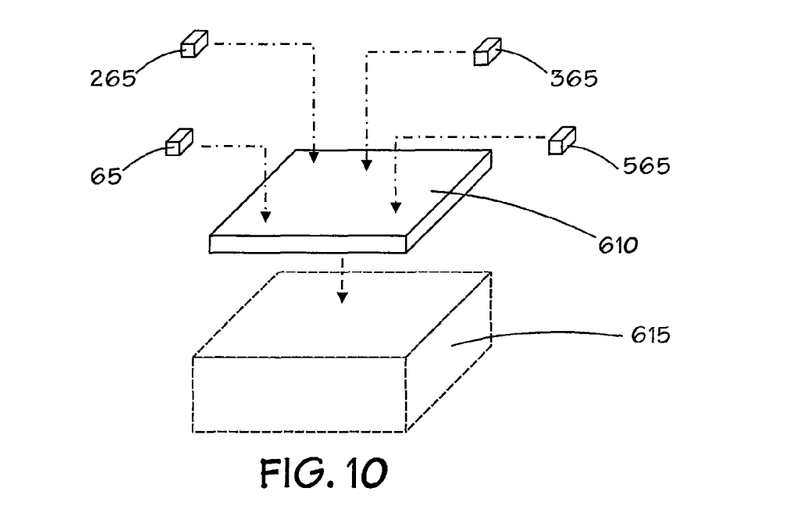
FIG. 10 is a pictorial view of an exemplary semiconductor chip that may use any of the embodiments of a capacitor disclosed herein.

Any of the embodiments disclosed herein may be used in a variety of contexts. In this regard, FIG. 10 depicts an exploded pictorial view of a semiconductor chip 610 that may be any of a myriad of different types of circuit devices used in electronics, such as, for example, microprocessors, graphics processors, application specific integrated circuits, memory devices or the like, and may be single or multi-core. Any of the capacitors disclosed herein may be incorporated into the semiconductor chip 520 or coupled thereto. For example, four capacitors, 65, 265, 365 and 565 may be coupled to or incorporated into the semiconductor chip 610. The semiconductor chip 610 may be connected to a computing device 615 which may be, for example, a digital television, a handheld mobile device, a personal computer, a server, a memory device, an add-in board such as a graphics card, or any other computing device employing semiconductors.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

In addition to hardware implementations of devices that provide the capacitor described above in the exemplary embodiments of the present invention such devices may also be embodied in software disposed, for example, in a computer usable (e.g., readable) medium configured to store the software (e.g., a computer readable program code). The program code causes the enablement of embodiments of the present invention, including the following embodiments: (i) the functions of the apparatus and methods disclosed herein (such as systems and methods for providing capacitance); (ii) the fabrication of the systems and methods disclosed herein (such as the fabrication of devices that are enabled to provide a capacitor structure); or (iii) a combination of the functions and fabrication of the systems and methods disclosed herein.

For example, this can be accomplished through the use of general programming languages (such as C or C++), hardware description languages (HDL) including Verilog, Verilog-A, HDL, VHDL, Altera HDL (AHDL) and so on, or other available programming and/or schematic capture tools (such as circuit capture tools). The program code can be disposed in any known computer usable medium including semiconductor, magnetic disk, optical disk (such as CD-ROM, DVD-ROM) and as a computer data signal embodied in a computer usable (e.g., readable) transmission medium (such as a carrier wave or any other medium including digital, optical, or analog-based medium). As such, the code can be transmitted over communication networks including the Internet and internets. It is understood that the functions accomplished and/or structure provided by the systems and techniques described above can be represented in a core (such as a media processing core) that is embodied in program code and may be transformed to hardware as part of the production of integrated circuits.

What is claimed is:

1. A method of manufacturing, comprising:
   forming a first capacitor plate having at least two non-linear shaped strips;
   forming a second capacitor plate having a non-linear shaped strip positioned between the at least two non-linear shaped strips of the first capacitor plate; and
   providing a dielectric between the non-linear shaped strip of the second capacitor plate and the at least two non-linear shaped strips of the first capacitor plate.

2. The method of claim 1, wherein the forming the first and second capacitor plates comprises forming each of the at least two non-linear shaped strips of the first capacitor plate and the non-linear shaped strip of the second capacitor plate with an arcuate shape.

3. The method of claim 1, wherein the forming the first and second capacitor plates comprises forming each of the at least two non-linear shaped strips of the first capacitor plate and the non-linear shaped strip of the second capacitor plate with a combined arcuate and stair step shape.

4. The method of claim 1, wherein the forming the first and second capacitor plates comprises forming each of the at least two non-linear shaped strips of the first capacitor plate and the non-linear shaped strip of the second capacitor plate with a wavy shape.

5. The method of claim 1, comprising coupling a semiconductor chip to the first and second capacitor plates.

6. The method of claim 5, wherein the first and second plates comprise a first pair of plates, the method including forming a second pair of capacitor plates on the semiconductor chip, a first plate of the second pair of plates including at least two non-linear shaped strips, and a second plate of the second pair of plates including a non-linear shaped strip positioned between the at least two non-linear shaped strips of the second plate of the second pair of plates, and a dielectric separating the first and second pairs of plates.

7. The method of 1, wherein the method is performed by synthesizing hardware description language instructions.

8. The method of claim 7, wherein the forming a dielectric comprises forming a plurality of successively vertically stacked insulating material layers.

9. The method of claim 7, comprising coupling a semiconductor chip to the first and second capacitor plates, the forming the first capacitor plate comprising forming at least two conductors interconnected by at least one via and the forming the second capacitor plate comprising forming at least two conductors interconnected by at least one via.

10. A method of manufacturing, comprising:
   forming a first capacitor plate having a first plurality of successively vertically stacked conductor structures;
   forming a second capacitor plate having a second plurality of successively vertically stacked conductor structures positioned adjacent to the first plurality of conductor structures; and
   forming a dielectric positioned between the first and second pluralities of successively vertically stacked conductor structures.

11. The method of claim 10, wherein the method is performed by synthesizing hardware description language instructions.

12. A method of manufacturing, comprising:
   providing a semiconductor chip;
   forming a first capacitor plate in the semiconductor chip, the first capacitor plate having a first bore therethrough;
   forming a capacitor dielectric in the first bore of the first capacitor plate, the capacitor dielectric having a second bore; and
   forming a second capacitor plate in the second bore of the capacitor dielectric.

13. The method of claim 12, wherein the forming the first capacitor plate comprises forming a first shell and the forming the capacitor dielectric comprises forming a second shell.

14. The method of claim 12, wherein the method is performed by synthesizing hardware description language instructions.

15. The method of claim 14, wherein the forming the first and second shells comprises forming first and second rectangular shells.

16. An apparatus, comprising:
   a first capacitor plate having at least two non-linear shaped strips;
   a second capacitor plate having a non-linear shaped strip positioned between the at least two non-linear shaped strips of the first capacitor plate; and
   a dielectric positioned between the non-linear shaped strip of the second capacitor plate and the at least two non-linear shaped strips of the first capacitor plate.

17. The apparatus of claim 16, wherein the non-linear shaped strips of the first and second conductor plates have an arcuate shape.

18. The apparatus of claim 16, wherein the non-linear shaped strips of the first and second conductor plates have a combined arcuate and stair step shape.

19. The apparatus of claim 16, wherein the non-linear shaped strips of the first and second conductor plates have a wavy shape.

20. The apparatus of claim 16, comprising a semiconductor chip coupled to the first and second capacitor plates.

21. The apparatus of claim 20, wherein the semiconductor chip is coupled to a computing device.

22. An apparatus, comprising:
   a first capacitor plate having first plurality of successively vertically stacked conductor structures;
   a second capacitor plate having a second plurality of successively vertically stacked conductor structures positioned adjacent to the first plurality of successively vertically conductor structures; and
   a dielectric positioned between the first and second pluralities of successively vertically stacked conductor structures.

23. The apparatus of claim 22, wherein the dielectric comprises a plurality of stacked insulating material layers.

24. The apparatus of claim 22, comprising a semiconductor chip coupled to the first and second capacitor plates, the first plurality of conductor structures comprises at least two conductors interconnected by at least one via and the second plurality of conductor structures comprises at least two conductors interconnected by at least one via.

25. The apparatus of claim 24, wherein the semiconductor chip is coupled to a computing device.

* * * * *

UNITED STATES PATENT AND TRADEMARK OFFICE
CERTIFICATE OF CORRECTION

| | | |
|---|---|---|
| PATENT NO. | : 8,014,125 B2 | Page 1 of 1 |
| APPLICATION NO. | : 11/945089 | |
| DATED | : September 6, 2011 | |
| INVENTOR(S) | : Drapkin et al. | |

It is certified that error appears in the above-identified patent and that said Letters Patent is hereby corrected as shown below:

Title Page
Item [56] "Other Publications" Section, please replace "PCT/1132008" with --PCT/IB2008--.

Column 9
Line 40, Claim 12, please replace "therethrough" with --there through--.

Signed and Sealed this

Seventeenth Day of April, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,014,125 B2 | Page 1 of 1 |
| APPLICATION NO. | : 11/945089 | |
| DATED | : September 6, 2011 | |
| INVENTOR(S) | : Drapkin et al. | |

It is certified that error appears in the above-identified patent and that said Letters Patent is hereby corrected as shown below:

In the Claims

<u>Column 9</u>

Line 10, please replace "second plate" with --first plate--.

<u>Column 9</u>

Line 14, please replace "claim 7" with --claim 10--.

Signed and Sealed this
Fifteenth Day of October, 2013

Teresa Stanek Rea
*Deputy Director of the United States Patent and Trademark Office*